(12) United States Patent
Clerc et al.

(10) Patent No.: US 8,497,701 B2
(45) Date of Patent: Jul. 30, 2013

(54) INTEGRATED CIRCUIT ELEMENTARY CELL WITH A LOW SENSITIVITY TO EXTERNAL DISTURBANCES

(75) Inventors: Sylvain Clerc, Grenoble (FR); Gilles Gasiot, Seyssinet (FR); Maximilien Glorieux, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/300,255

(22) Filed: Nov. 18, 2011

(65) Prior Publication Data
US 2013/0009665 A1    Jan. 10, 2013

(30) Foreign Application Priority Data
Jul. 4, 2011   (FR) ...................... 11 56019

(51) Int. Cl.
*H03K 17/16*   (2006.01)
*H03K 3/037*   (2006.01)

(52) U.S. Cl.
USPC ............................ 326/28; 326/27; 327/206

(58) Field of Classification Search
USPC .. 326/26–28, 95–98, 112, 119, 122; 327/205, 327/206, 185, 208, 210–214, 219
See application file for complete search history.

(56) References Cited

U.S. PATENT DOCUMENTS

| | | | | |
|---|---|---|---|---|
| 3,984,703 A | * | 10/1976 | Jorgensen | 327/206 |
| 5,341,033 A | * | 8/1994 | Koker | 327/206 |
| 5,945,859 A | * | 8/1999 | Pang | 327/206 |
| 6,448,830 B1 | * | 9/2002 | Chuang et al. | 327/205 |
| 6,573,774 B1 | * | 6/2003 | Gardner | 327/201 |
| 7,719,887 B2 | | 5/2010 | Cannon et al. | |

FOREIGN PATENT DOCUMENTS
EP    0 708 447    4/1996

* cited by examiner

*Primary Examiner* — Daniel D Chang
(74) *Attorney, Agent, or Firm* — Slater & Matsil, L.L.P.

(57) ABSTRACT

The present invention relates to an integrated electronic circuit including elements enabling to implement a logic function and means for attenuating the sensitivity of said elements to external disturbances, said attenuation means being disconnectable during phases of intentional modification of the state of said elements.

24 Claims, 4 Drawing Sheets

US 8,497,701 B2

INTEGRATED CIRCUIT ELEMENTARY CELL WITH A LOW SENSITIVITY TO EXTERNAL DISTURBANCES

This application claims the benefit of French National patent application Ser. No. 11/56019, filed on Jul. 4, 2011, entitled "Integrated Circuit Elementary Cell with a Low Sensitivity to External Disturbances," which application is hereby incorporated herein by reference.

TECHNICAL FIELD

The present invention relates to an elementary integrated circuit logic cell. More specifically, the present invention relates to such a cell which has a low sensitivity to external disturbances.

BACKGROUND

Many elementary logic cells of integrated circuits, for example for forming memory arrays, are known. Such integrated elementary cells are submitted to many external disturbances, and may especially be particularly sensitive to heavy ion impacts. Such impacts generate eddy currents which, according to the impact location on the circuit, are capable of modifying the state of junctions in the semiconductor material of the integrated circuit, and thus of modifying the cell state.

FIG. 1A illustrates a conventional synchronous inverter circuit capable of being used in an elementary memory cell.

This circuit comprises a series association, between a terminal of application of a D.C. voltage Vdd and the ground, of a first and of a second P-channel transistors, p1 and p2, and of a first and of a second N-channel transistors, n3 and n4. Input terminal IN of the circuit is connected to the gates of transistors p1 and n4 and output terminal OUT of the circuit is connected to the junction point of transistors p2 and n3. The gates of transistors n3 and p2 respectively receive a clock signal CLK and its inverse.

A disadvantage of a simple cell such as in FIG. 1A is that, if a heavy ion reaches a node of the circuit and causes a switching of this node, or causes a switching of the state of a transistor, the circuit output level may be directly affected.

To ascertain that the information contained in a memory or in elementary logic cells is not modified by the external power inputs, it is known to form improved memory cells for example providing a redundancy of the stored information.

Patent EP 0 708 447, incorporated herein by reference, describes a memory cell comprising two interlaced information storage loops: the information is stored at two locations of the cell, at the level of nodes belonging to each of the two loops. If a disturbance occurs on one of the nodes, the redundancy of the memory cell structure enables to restore the information over the entire cell.

However, such a circuit requires a large number of transistors, which implies a high power consumption. Further, several heavy ion impacts could occur at the same time on the circuit at two locations close to the two information storage areas. The memory state can thus be modified.

U.S. Pat. No. 7,719,887, incorporated herein by reference, provides forming a data storage register associating two logic gates head-to-tail. A capacitive structure is provided in parallel with the two logic gates. The current to be used to switch the state of nodes of this structure is thus increased. The disadvantage of this structure is that the power required to intentionally write into the structure must also be high.

FIG. 1B illustrates a circuit known as a Schmitt trigger. This circuit comprises a series association of four transistors, p1 and p2 of type P and n3 and n4 of type N, between a terminal of application of a D.C. voltage Vdd and ground. Circuit input IN is connected to the gates of transistors p1, p2, n3, and n4 and circuit output OUT is connected to the junction point of transistors p2 and n3.

A P-type transistor, p5, is placed between the junction point of transistors p1 and p2 and ground. The gate of transistor p5 is connected to output OUT of the circuit. An N-type transistor, n6, is placed between the junction point of transistors n3 and n4 and terminal Vdd. The gate of transistor n6 is connected to output OUT of the circuit.

Transistors p5 and n6 avoid for a temporary switching of the state of a transistor, caused for example by a heavy ion impact, to modify the circuit output state. Indeed, these transistors create a loop which opposes state switchings of the circuit. However, this solution has the disadvantage that it also involves more power and write time to intentionally modify the circuit state. Such increases in consumption and delays are generally not desired.

There thus is a need for an elementary cell having a significant robustness with respect to external disturbances, and which does not require a high write power.

SUMMARY OF THE INVENTION

In one aspect, embodiments of the present invention provide for an integrated electronic circuit comprising elements implementing a logic function and means for attenuating the sensitivity of said elements to external disturbances. The attenuation means are disconnectable during phases of intentional modification of the state of said elements.

In another aspect, embodiment of the present invention provide for a circuit comprising a logic circuit and an attenuator circuit. The logic circuit has an output configured to have a first state and a second state. The attenuator circuit is coupled to the output, and is configured to operate in a first mode that resists a change in state of the output and a second mode that does not resist a change in state of the output.

In yet another aspect, embodiments of the present invention provide for an integrated circuit comprising at least one logic circuit having an input node and an output node, the output node configured to have a first state and a second state. The integrated circuit also includes at least one attenuator circuit associated with the at least one logic circuit and coupled to the output of the at least one logic circuit, the at least one attenuator circuit having an activation signal input. The at least one attenuator circuit is configured to, in response to a first activation signal, resist a change in state of the output of the logic device, and in response to a second activation signal, not resist a change in state of the output of the logic device.

BRIEF DESCRIPTION OF THE DRAWINGS

For clarity, the same elements have been designated with the same reference numerals in the different drawings and, further, as usual in the representation of integrated circuits, the various drawings are not to scale. For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
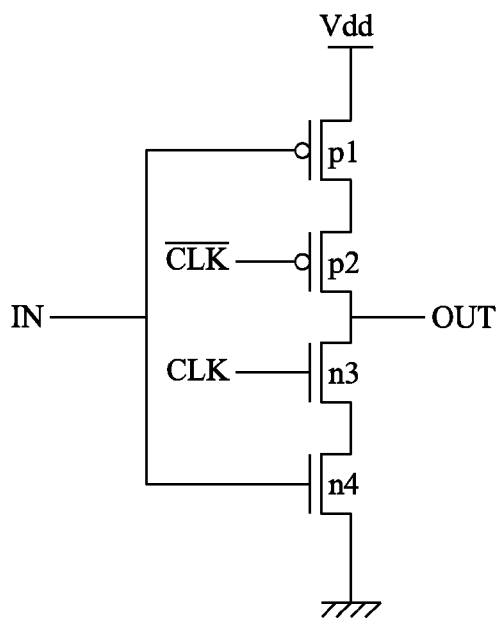
FIGS. 1A and 1B, previously described, respectively illustrate a synchronous inverter circuit and a Schmitt trigger circuit.

Before addressing the illustrated embodiments in detail, various embodiments and advantageous features thereof are discussed generally in the following paragraphs.

An advantageous feature of some embodiments is to provide an elementary integrated circuit cell having an improved robustness against external disturbances. Another advantageous feature of some embodiments is to provide such a cell having a decreased consumption in an intentional state switching. Yet another advantageous feature of some embodiments is to provide logic cells and data storage systems involving one or several robust elementary cells.

Thus, an embodiment provides an integrated electronic circuit comprising elements enabling to implement a logic function and means for attenuating the sensitivity of the elements to external disturbances, the attenuation means being disconnectable in phases of intentional modification of the state of the elements, said means for attenuating (12) receiving a writing activating signal (ACT) indicating said phases of intentional modification of the state of said elements.

According to an embodiment, the elements enabling to implement a logic function comprise a series association, between a first and a second terminal of application of a D.C. voltage, of a first and of a second MOS transistor of a first conductivity type and of a third and of a fourth MOS transistor of a second conductivity type, a first input terminal being connected to the gate of the first and fourth MOS transistors, an output terminal being connected to the junction point of the second and third transistors, the gates of the second and third transistors being connected to a second input terminal.

According to an embodiment, the attenuation means comprise a fifth MOS transistor of the first conductivity type connected between a third input terminal and the junction point of the first and second MOS transistors, and a sixth MOS transistor of the second conductivity type connected between a fourth input terminal receiving a signal inverse to that on the third input terminal and the junction point of the third (N3) and foruth (N4) MOS transistors, the gates of the fifth and sixth MOS transistors being connected to the output terminal of the circuit.

According to an embodiment, the first and second input terminals are connected.

According to an embodiment, the gate of the second MOS transistor and the gate of the third MOS transistor respectively receive a clock signal and a signal inverse to the clock signal.

According to an embodiment, the signal on the third input terminal depends on the clock signal.

According to an embodiment, the means for attenuating the circuit sensitivity force the signal on the third input terminal to a low state and the means enabling to inhibit the operation of the attenuation means force the signal on the third input terminal to a high state.

According to an embodiment, the circuit further comprises a fifth input terminal for resetting to zero the state of the circuit output.

An embodiment further provides a logic NOR gate comprising a circuit such as hereabove, further comprising a sixth input terminal connected to the gate of a seventh and of an eighth MOS transistor of a first conductivity type, the seventh MOS transistor being connected between the first terminal of application of a D.C. voltage and the first MOS transistor, the eighth MOS transistor being connected between the third input terminal and the fifth MOS transistor, further comprising a ninth MOS transistor of a second conductivity type placed between the circuit output and the second terminal of application of a D.C. voltage, the gate of the ninth transistor being connected to the sixth input terminal.

An embodiment further provides a latch register comprising an association of at least a first and a second circuit such as hereabove, said first and second circuits being cross-coupled.

The foregoing and other features and advantages will be discussed in detail in the following non-limiting description of specific embodiments in connection with the accompanying drawings.

Figure 2:
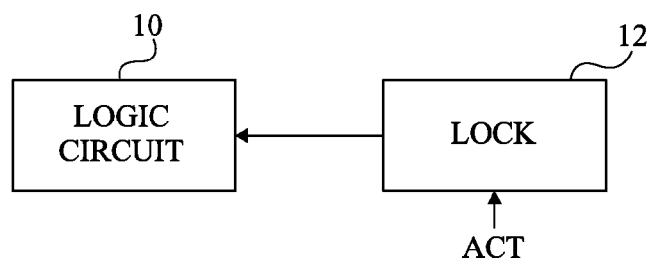
FIG. 2 illustrates, in the form of blocks, a device according to an embodiment.

FIG. 2 illustrates in the form of blocks the operation of a circuit according to an embodiment. The circuit comprises integrated elements 10 (LOGIC CIRCUIT) enabling to implement a logic function. Means 12 (LOCK) enabling to decrease the sensitivity of elements 10 to external disturbances are provided. Advantageously, means 12 enabling to increase the robustness of the circuit with respect to external disturbances may be disconnected in phases of intentional modification of the circuit state, for example, in phases of writing into the circuit. To achieve this, means 12 receive, on an input, a write activation signal ACT having a state which varies according to the circuit state: signal ACT is in a first state (low) in phases of retention of the circuit information where the robustness is increased and in a second state (high) in phases of intentional modification, that is, not caused by external disturbances of the circuit state.

As an example, signal ACT may be associated with a clock signal if the electronic circuit enabling to implement a logic function is a circuit having its state switchings synchronized with such a clock signal. For example, if the circuit of FIG. 2 is integrated in a latch-type bistable circuit, signal ACT may correspond to the clock signal or to its inverse.

Figure 3:
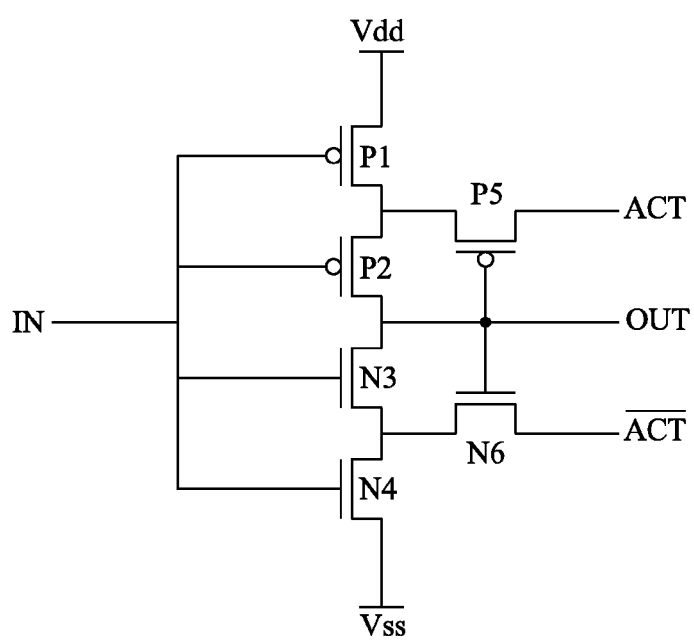
FIG. 3 illustrates an inverter circuit forming an elementary logic cell according to an embodiment.

FIG. 3 illustrates an inverter circuit forming a basic cell of a device according to an embodiment. This circuit comprises, between two terminals of application of a D.C. voltage, Vdd and Vss (Vss for example being a ground line), a series association of a first P-channel MOS transistor, P1, of a second P-channel MOS transistor, P2, of a third N-channel MOS transistor, N3, and of a fourth N-channel MOS transistor, N4. An input terminal IN is connected to the gates of transistors P1, P2, N3, and N4. An output terminal of the circuit, OUT, is connected to the junction point of transistors P2 and N3.

The above elements form a circuit enabling to implement an inverse logic function (block 10).

A fifth P-channel MOS transistor, P5, and a sixth N-channel MOS transistor, N6, are also provided and form, in association with an input terminal of a write activation signal ACT, the data locking means which ensure the circuit robustness when write activation signal ACT is in the low state.

The fifth MOS transistor, P5, is placed between a terminal of application of write activation signal ACT and the junction point of transistors P1 and P2. The sixth MOS transistor, N6, is placed between a terminal of application of the inverse of the write activation signal and the junction point of transistors N3 and N4. The gates of transistors P5 and N6 are connected to circuit output OUT.

When the write activation signal is in a low state, the circuit of FIG. 3 is locked and only slightly sensitive to external disturbances, and especially to heavy ion impacts.

In this case, if the input of circuit IN is in the high state, transistors N3 and N4 are on and transistors P1 and P2 are off, which forces output OUT to a low state. Transistor P5 of the system for locking the circuit state is also conductive, which causes a biasing of the junction point of transistors P1 and P2 to the low state. Thus, if a heavy ion impact had modified the state of a circuit node, for example, temporarily, the state of the input signal, which would amount to turning-on transistors P1 and P2, there would be a conflict between the signal at zero originating from write activation input ACT (via transistor P5) and the signal originating from terminal Vdd (via transistor P1). This conflict avoids for the output state to vary if the heavy ion impact causes a temporary modification of the input state, since the injection of carriers by transistor P5 opposes the state switching of the output.

Conversely, if the input of circuit IN is in the low state, transistors P1 and P2 are on and transistors N3 and N4 are off, which forces output OUT to a high state. Transistor N6, which is turned on by the state of output OUT, thus brings a high voltage to the junction point of transistors N3 and N4.

Figure 1B:
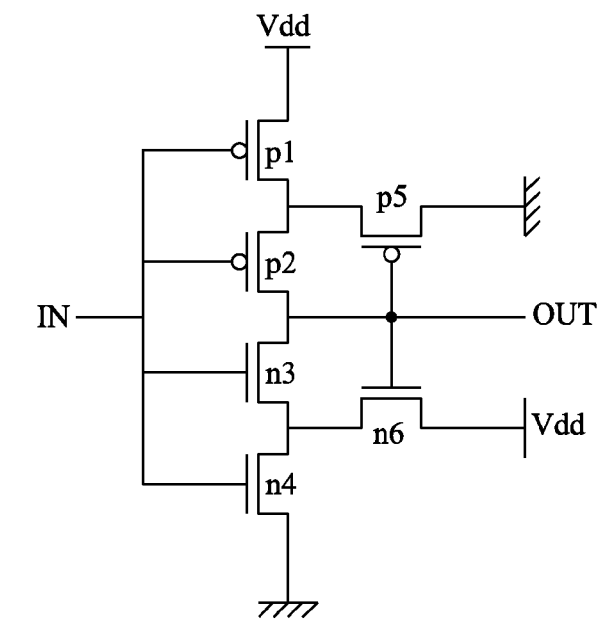

A state switching due to an external disturbance is thus made difficult when signal ACT is in the low state. Indeed, in this configuration, the device reacts to disturbances or state switchings in the same way as the Schmitt trigger of FIG. 1B. By adequately sizing transistors P5 and N6 with respect to the other MOS transistors, an operation in which a temporary disturbance of the circuit state has little or no influence on the circuit output may be provided, an intentional state switching of the circuit being however possible by imposing an input signal IN sufficiently long for the state of transistors P1, P2, N3, and N4 to vary and to modify the state of output OUT, to the detriment of the current injection caused by transistors P5 and N6.

Thus, an intentional modification of the circuit state can always be performed. However, such a modification implies a long response time of the circuit and a significant power consumption, since the input signal must vary for a sufficiently long time for the current injection by transistors P1 and P2 or N3 and N4 to oppose the current injected by transistor P5 or N6.

To avoid an overconsumption of power and a long response time in phases of intentional modification of the circuit state, a signal ACT in the high state is provided during such phases.

When write activation signal ACT is in a high state, according to the state of input IN, transistor P5, respectively N6, applies a signal in the high state, respectively in the low state, to the junction point of transistors P1 and P2, respectively N3 and N4. This voltage imposed between transistors P1 and P2 or N3 and N4 follows the same variation as that imposed on output OUT. Thus, transistors P5 and N6 have no influence on the circuit operation in this case.

Thus, the circuit is made more robust against heavy ion impacts in information retention phases (signal ACT in a low state) but remains responsive and keeps a low power consumption in circuit state switching phases (signal ACT in a high state).

Figure 4:
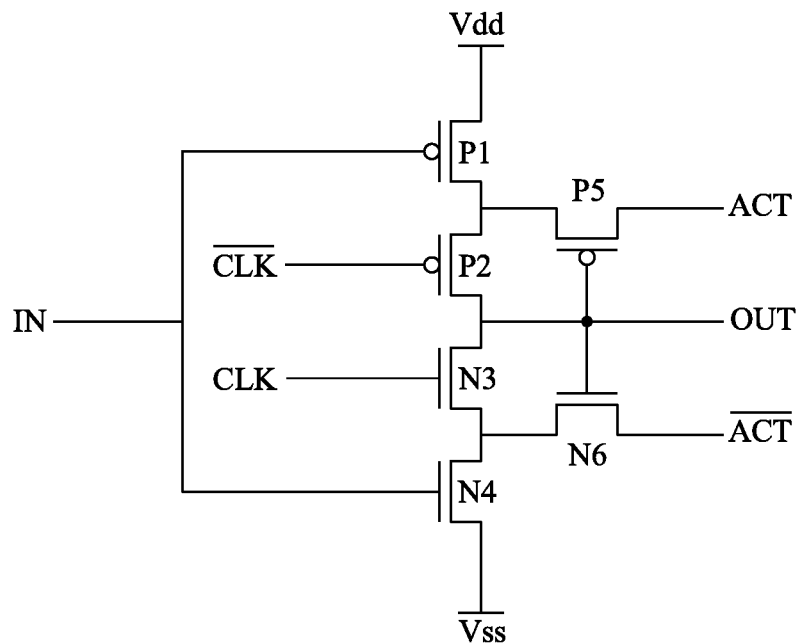
FIG. 4 illustrates a variation of a synchronous inverter circuit according to an embodiment.

FIG. 4 illustrates a variation of a synchronous inverter circuit according to an embodiment. The circuit of FIG. 4 is identical to the circuit of FIG. 3 except that the gates of transistors P2 and N3, instead of being connected to input terminal IN, are connected to a clock signal CLK. More specifically, the gate of transistor N3 is connected to a terminal of application of a clock signal CLK and the gate of transistor P2 is connected to a terminal of application of a signal inverse to the clock signal. This structure enables to synchronize the modification of the circuit state with a high state of the clock signal. It should be noted that an inverted structure of the clock inputs on the gates of transistors P2 and N3 may also be provided if desired.

The circuit operation, when clock signal CLK is in the high state, is the same as hereabove. When clock signal CLK is in the low state, the circuit output state is blocked (the output is floating or at high impedance).

Advantageously, if switchings of the circuit state (writing) are authorized on a high state of the clock signal, it may be provided for signal ACT to be identical to clock signal CLK. Indeed, in this case, when signal CLK, and thus ACT, is in the high state, an efficient writing into the circuit may be performed. When signal CLK, and thus ACT, is in the low state, the writing is forbidden and the circuit is modified in parallel to have a greater resistance to heavy ion impacts. Similarly, if changes are authorized on a low state of the clock signal, it may be provided for signal ACT to be identical to the inverse clock signal.

Based on the basic circuits, be they synchronous or not, of FIGS. 3 and 4, many logic gates having an improved robustness with respect to external disturbances may be formed.

Figure 5:
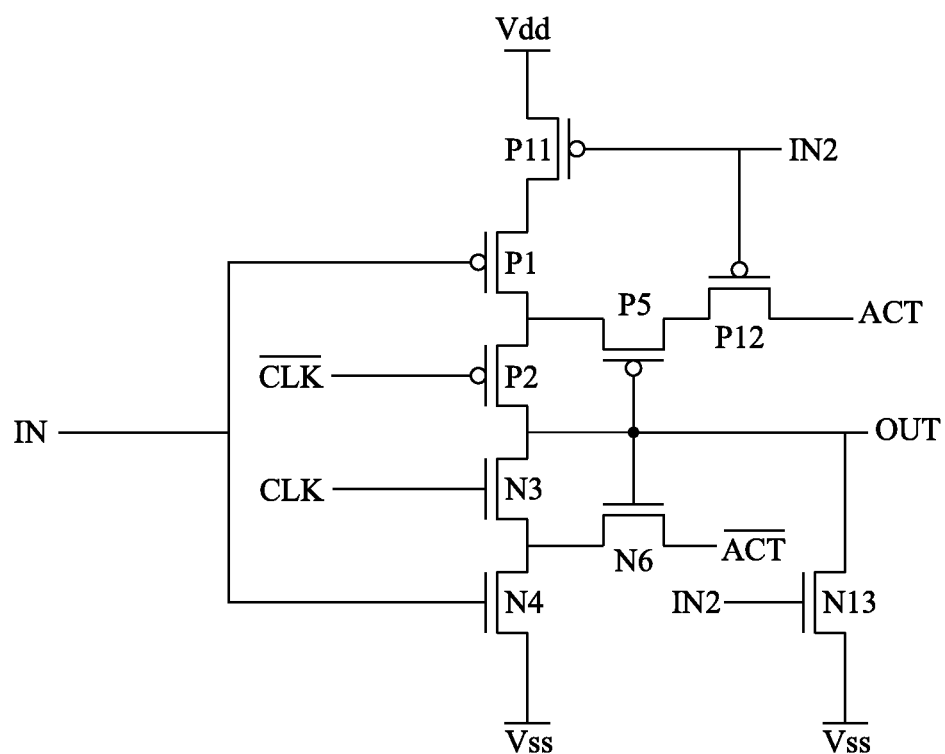
FIG. 5 illustrates a logic NOR circuit according to an alternative embodiment.

FIG. 5 illustrates a circuit according to an alternative embodiment, forming a synchronous NOR logic circuit between two inputs IN and IN2. A difficulty in the forming of such a circuit is the combination of the advantages of robustness of the above circuits with a gate performing a NOR logic function.

The circuit of FIG. 5 resumes all the elements of the synchronous inverter circuit of FIG. 4. It also comprises a second input IN2 forming the second input of the NOR circuit.

The circuit of FIG. 5 further comprises two P-channel MOS transistors, P11 and P12, and one N-channel MOS transistor, N13, each receiving signal IN2 on their respective gates. Transistor P11 is placed between terminal Vdd and transistor P1, transistor P12 is placed between transistor P5 and a terminal of application of write activation signal ACT, and transistor N13 is placed between the output terminal of circuit OUT and terminal Vss.

This circuit enables to carry out a NOR function between inputs IN and IN2, synchronized on a high state of clock signal CLK, when write activate signal ACT is in the high state. When signal ACT is in the low state, this circuit has an improved robustness against external disturbances. As seen previously, in the synchronous circuit of FIG. 5, signal ACT may be associated with clock signal CLK (signals identical or inverse to each other).

The circuit of FIG. 5 may also form an inverter circuit having a reset input if input IN2 receives a reset signal.

Thus, an assembly of asynchronous or synchronous logic gates, but also registers or flip-flops, may be formed from the circuits of FIGS. 3 and 4, for example to form elementary memory structures.

Figure 6:
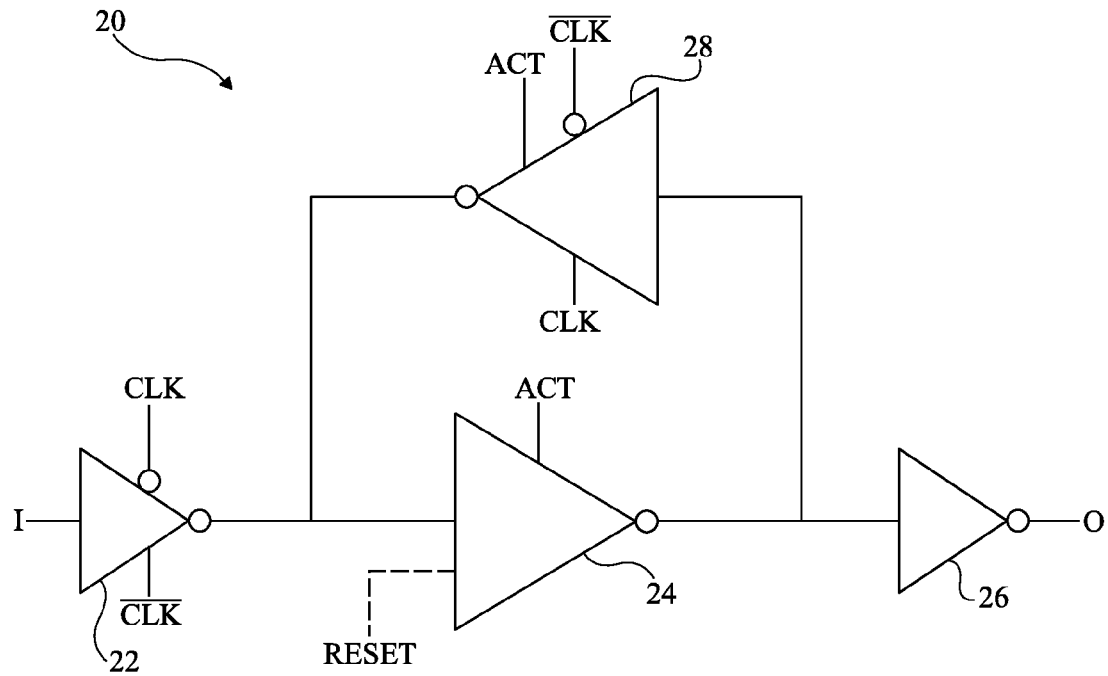
FIG. 6 illustrates a register involving one or several circuits according to an embodiment.

FIG. 6 illustrates a register likely to involve one or several circuits according to an embodiment. Register 20 of FIG. 6 comprises an input terminal I and an output terminal O. An association of a first, of a second, and of a third inverter, respectively called 22, 24, and 26, is provided between these two terminals. A fourth inverter 28 is provided in parallel with the second inverter 24, the input of inverter 28 being connected to the output of inverter 24 and conversely (inverters 24 and 28 are cross-coupled).

In the shown example, inverter 26 may be of any known type. Inverter 22 is synchronous, for example, as described in relation with FIG. 1A. Inverters 24 and 28 are of the type described in relation with any of FIGS. 2 to 5, and receive a write activation signal ACT. Inverters 24 and 28 may be synchronous (clock signal CLK illustrated in dotted lines) or asynchronous. They may also have a reset input terminal, RESET, as shown in dotted lines for inverter 24. For this purpose, inverter 24 may be replaced with a NOR circuit such as the circuit of FIG. 5, the second input of the NOR gate then being a reset input.

Register 20 shown in FIG. 6, due to the use of inverter circuits such as those in FIGS. 3 to 5, advantageously has an improved resistance to external disturbances, while providing a low write time (when signal ACT is in the high state). Memories having reasonable write times can thus be formed while ensuring, in phases of retention of the stored information, a decreased sensitivity to external disturbances.

Figure 7:
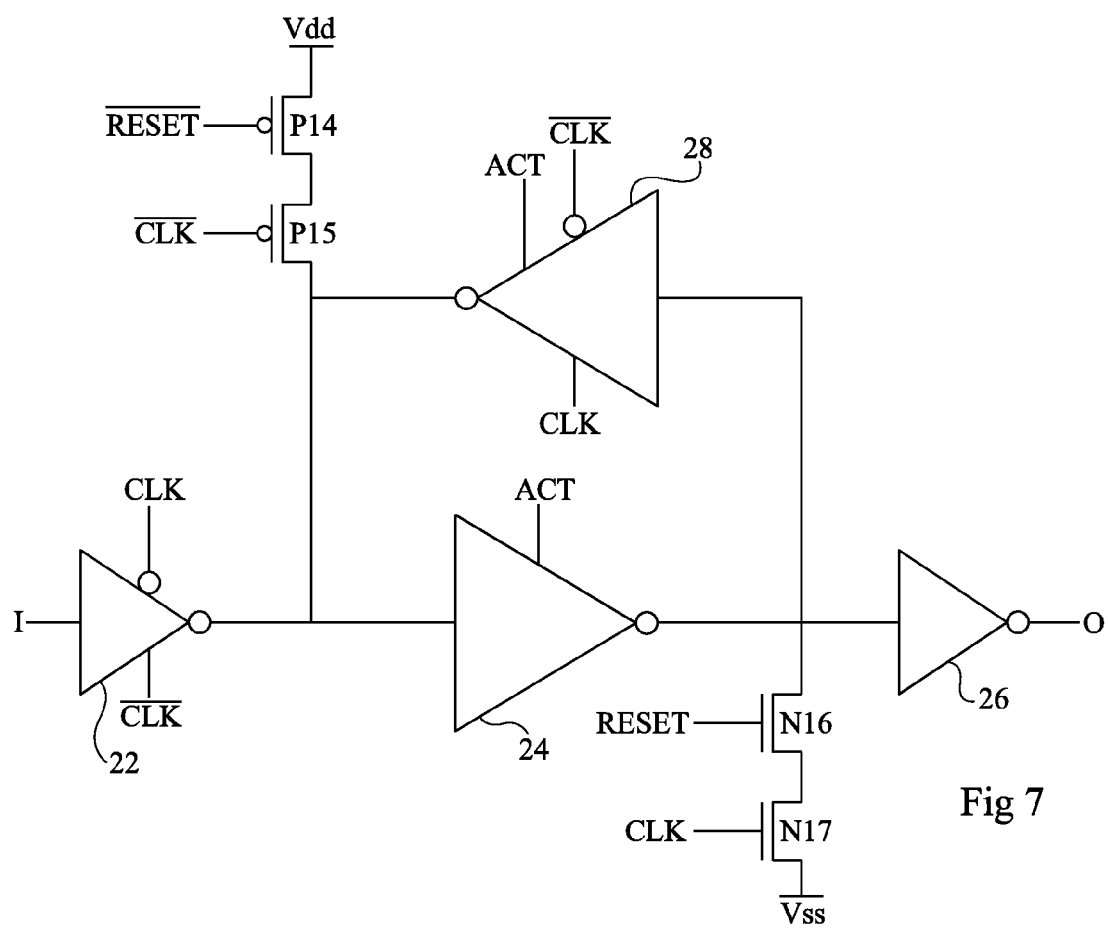
FIG. 7 illustrates a variation of the register of FIG. 6.

FIG. 7 illustrates a synchronous register similar to the register of FIG. 6 in which inverter 24 is asynchronous (for example, of the type described in relation with FIG. 2) and inverter 28 is synchronous when the clock signal CLK is in the high state (for example, of the type described in relation with FIG. 3). The inverter 22 is synchronous when the clock signal CLK is in the low state. The bistable circuit of FIG. 7 further comprises two pairs of MOS transistors, P14/P15 and N16/N17, enabling to carry out a device resetting step if necessary.

For this purpose, a first pair of MOS transistors formed in series, P14 and P15, is placed between a terminal of application of a D.C. voltage Vdd and the output of inverter 28. Transistor P14 receives on its gate a signal inverse to a reset signal and transistor P15 receives on its gate a clock signal. A second pair of MOS transistors formed in series, N16 and N17, is placed between a terminal of application a D.C. voltage Vss, for example, the ground, and the output of inverter 24. Transistor N16 receives signal RESET on its gate and transistor N17 receives a clock signal CLK on its gate.

This circuit enables to reset to zero the circuit output while avoiding short-circuit issues in the register. Indeed, the use of transistors P15 and N17 controlled by the clock signals enables to avoid the forcing to opposite states of the outputs of inverters 22 and 28. It should be noted that, in this example of synchronous register, a case where signal ACT corresponds to clock signal CLK is considered.

When clock signal CLK is in a low state, inverter 22 is on, transistor P15 is off and the possible reset signal does not act at the output of inverters 22 and 28, which avoids a conflict with inverter 22. When clock signal CLK is in a high state, inverter 28 is on while inverter 22 has a floating state, and the possible reset signal acts at the output of inverters 28 and 24.

Other alternative embodiments enabling to use a reset signal may be provided.

Figure 8:
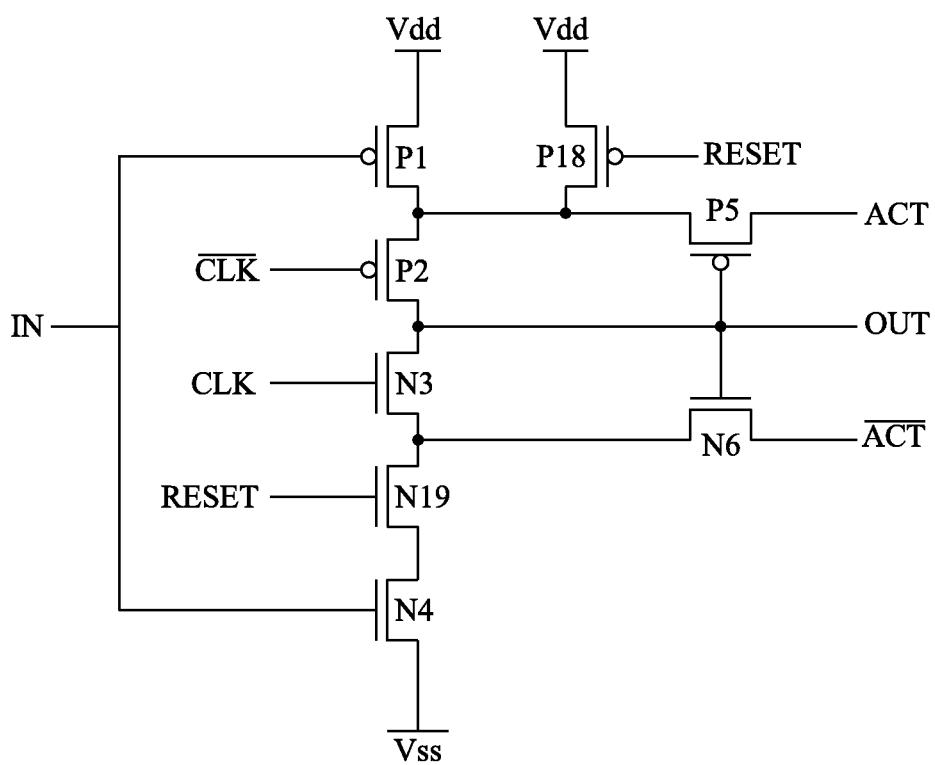
FIG. 8 illustrates a synchronous inverter circuit comprising a reset input according to another embodiment and capable of being used in the register of FIGS. 6 and 7.

FIG. 8 illustrates a variation of a synchronous inverter circuit capable of using a reset signal, for example, to replace inverter 28 of FIG. 6.

The circuit of FIG. 8 shows all the elements of the circuit of FIG. 4. It further comprises, between terminal Vdd and the junction between transistors P1 and P2, a P-channel transistor P18 having its gate controlled by a reset signal, RESET. It further comprises, in series between transistors N3 and N4, an N-channel transistor N19 having its gate controlled by signal RESET. Transistor N6 is connected between a terminal of application of signal and the junction point of transistors N3 and N19.

Advantageously, a circuit such as that in FIG. 8 may replace inverter 28 of the register of FIG. 6 to provide a circuit where a resetting of the circuit is possible. In this case, transistor P18 plays the same role as transistor P14 of the register of FIG. 6 and transistor P2 plays the same role as transistor P15 of the register of FIG. 6. A register such as that in FIG. 6, in which inverter 28 is of the type shown in FIG. 8, thus provides an operation identical to that of the register of FIG. 7. Advantageously, the direct integration of the reset function in the structure of inverter 28 enables to decrease the register complexity.

Specific embodiments have been described. Various alterations, modifications, and improvements will occur to those skilled in the art. In particular, it should be noted that the circuit discussed herein may also operate by using MOS transistors having conductivity types inverse to those discussed herein. It will be within the abilities of those skilled in the art to easily adapt the states of the signals to be provided at the circuit input to obtain an operation identical to that discussed herein.

Various embodiments with different variations have been described hereabove. It should be noted that those skilled in the art may combine various elements of these various embodiments and variations.

In particular, examples of synchronous or asynchronous circuits have been discussed herein. It should be noted that the various asynchronous variations discussed herein may also be modified to be synchronized on a clock signal and, conversely, synchronous circuits may be made asynchronous. In the case of synchronous circuits, the write activation signal may be associated with the clock signal. It may also be provided to form any type of logic gate, latch, register, from the basic inverter circuits of FIGS. 3 and 4. In particular, synchronous latches with a resetting to zero, a forcing to one, or both, may be formed.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated electronic circuit comprising:
 a first logic portion, comprising:
  elements implementing a logic function; and
  means for attenuating the sensitivity of said elements to external disturbances, said means for attenuating configured to receive a writing activating signal indicating phases of intentional modification of the state of the elements, said means for attenuating further configured to provide the write activating signal to the elements, wherein the write activating signal resists a change in the state of the elements, wherein the write activating signal resists the change outside of phases of intentional modification of the state of the elements.

2. The circuit of claim 1, wherein the elements enabling to implement a logic function comprise a series association, between first and second terminals of application of a D.C. voltage, of first and second MOS transistors of a first conductivity type and of third and fourth MOS transistors of a second conductivity type, a first input terminal being connected to the gate of the first and fourth MOS transistors, an output terminal being connected to the junction point of the second and third transistors, the gates of the second and third transistors being connected to a second input terminal.

3. The circuit of claim 2, wherein the attenuation means comprise a fifth MOS transistor of the first conductivity type connected between a third input terminal and the junction point of the first and second MOS transistors, and a sixth MOS transistor of the second conductivity type connected between a fourth input terminal receiving a signal inverse to that on the third input terminal and the junction point of the third and fourth MOS transistors, the gates of the fifth and sixth MOS transistors being connected to the output terminal of the circuit.

4. The circuit of claim 3, wherein the means for attenuating the circuit sensitivity force the signal on the third input terminal to a low state and the means enabling to inhibit the operation of the attenuation means force the signal on the third input terminal to a high state.

5. The circuit of claim 2, wherein the first and second input terminals are connected.

6. The circuit of claim 2, further comprising a fifth input terminal for resetting to zero the state of the circuit output.

7. The circuit of claim 3, further comprising a sixth input terminal connected to the gate of a seventh and of an eighth MOS transistors of a first conductivity type, the seventh MOS transistor being connected between the first terminal of application of a D.C. voltage and the first MOS transistor, the eighth MOS transistor being connected between the third input terminal and the fifth MOS transistor, further comprising a ninth MOS transistor of a second conductivity type placed between the circuit output and the second terminal of application of a D.C. voltage, the gate of the ninth transistor being connected to the sixth input terminal.

8. The circuit of claim 3, wherein the gate of the second MOS transistor and the gate of the third MOS transistor respectively receive a clock signal and a signal inverse to said clock signal.

9. The circuit of claim 8, wherein the signal on the third input terminal depends on said clock signal.

10. The circuit of claim 1 further comprising second elements implementing a second logic function and second means for attenuating the sensitivity of said second elements to external disturbances, said second attenuation means being disconnectable during phases of intentional modification of the state of said second elements.

11. The circuit of claim 10 wherein the elements and the second elements form a latch.

12. The circuit of claim 1, further comprising a second logic portion and a third logic portion, said first and second logic portions being cross-coupled.

13. A circuit comprising:
a logic circuit having an output, the output configured to have a first state and a second state; and
an attenuator circuit coupled to the output, the attenuator circuit configured to operate in a first mode that resists a change in the state of the output and a second mode that does not resist a change in state of the output, the attenuator circuit further configured to provide a signal indicating the first mode and the second mode to the logic circuit.

14. The circuit of claim 13, wherein the logic circuit is an element selected from the group consisting of an inverter and a logic gate.

15. The circuit of claim 13, wherein:
the logic circuit further comprises a first transistor and a second transistor of p-type having a first common junction point, and a third transistor and a fourth transistor of n-type having a second common junction point; and
wherein
the attenuator circuit further comprises:
a first transistor having a first terminal tied to the first common junction point, a second terminal tied to an activation signal node, and a gate terminal tied to the output of the logic circuit; and
a second transistor having a first terminal tied to the second common junction point, a second terminal tied to an inverse activation signal node, and a gate terminal tied to the output of the logic circuit.

16. The circuit of claim 15, wherein the attenuator circuit operates in the first mode when the activation signal is in a low state.

17. The circuit of claim 15, wherein:
a respective gate terminal of the first transistor and the third transistor of the logic circuit is tied to an input signal node; and
a gate terminal of the second transistor of the logic circuit is tied to a clock signal node; and
a gate terminal of the fourth transistor is tied to an inverse clock signal node.

18. The circuit of claim 13, further comprising:
a second logic circuit having a second output, the second output configured to have a first state and a second state; and
a second attenuator circuit coupled to the second output, the second attenuator circuit configured to operate in a first mode that resists a change in state of the second output and a second mode that does not resist a change in state of the second output.

19. The circuit of claim 13 wherein the output of the logic circuit is coupled to an input of the second logic circuit and the output of the second logic circuit is coupled to an input of the logic circuit.

20. An integrated-circuit comprising:
at least one logic circuit, the logic circuit having an input node and an output node, the output node configured to have a first state and a second state; and
at least one attenuator circuit associated with the at least one logic circuit and coupled to the output of the at least one logic circuit, the at least one attenuator circuit having an activation signal input;
wherein the at least one attenuator circuit is configured to, in response to a first activation signal, resist a change in state of the output of the logic device, and in response to a second activation signal, not resist a change in state of the output of the logic device, the at least one attenuator circuit further configured to provide the first activation signal to the logic circuit.

21. The integrated-circuit of claim 20, wherein the logic circuit includes an inverter, and wherein the attenuator circuit resists a change in the state of the output of the logic device by tying a node of the inverter to a predetermined voltage level.

22. The integrated-circuit of claim 21, wherein the predetermined voltage level is equivalent to the voltage level associated with the state of the output.

23. The integrated circuit of claim 22, further comprising a clock generator, and wherein the inverter receives a clock signal and an inverted clock signal from the clock generator.

24. The integrated circuit of claim 21, further comprising a latch, the latch including:
a first logic circuit, the first logic circuit having a first input node and a first output node, the first output node configured to have a first state and a second state;

a first attenuator circuit associated with the first logic circuit and coupled to the first output of the first logic circuit, the first attenuator circuit having an activation signal input, the first attenuator circuit configured to, in response to a first activation signal, resist a change in state of the output of the first logic device, and in response to a second activation signal, not resist a change in state of the output of the first logic device;

a second logic circuit, the second logic circuit having a second input node coupled to the output node of the first logic circuit, and a second output node, the second output node being coupled to the first input node of the first logic circuit and configured to have a first state and a second state;

a second attenuator circuit associated with the second logic circuit and coupled to the second output of the second logic circuit, the second attenuator circuit having an activation signal input, the second attenuator circuit configured to, in response to a first activation signal, resist a change in state of the output of the second logic device, and in response to a second activation signal, not resist a change in state of the output of the second logic device.

\* \* \* \* \*